US011251401B2

(12) United States Patent
Kim et al.

(10) Patent No.: US 11,251,401 B2
(45) Date of Patent: Feb. 15, 2022

(54) ORGANIC LIGHT-EMITTING DISPLAY APPARATUS AND FABRICATION METHOD THEREOF

(71) Applicant: SAMSUNG DISPLAY CO., LTD., Yongin-si (KR)

(72) Inventors: Sunkwang Kim, Yongin-si (KR); Kinyeng Kang, Yongin-si (KR); Suyeon Sim, Yongin-si (KR); Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 6 days.

(21) Appl. No.: 16/927,872

(22) Filed: Jul. 13, 2020

(65) Prior Publication Data
US 2020/0343485 A1 Oct. 29, 2020

Related U.S. Application Data

(63) Continuation of application No. 16/734,275, filed on Jan. 3, 2020, now Pat. No. 10,714,707, which is a
(Continued)

(30) Foreign Application Priority Data

Feb. 16, 2016 (KR) .................. 10-2016-0017771

(51) Int. Cl.
*H01L 51/52* (2006.01)
*H01L 51/00* (2006.01)
*H01L 27/32* (2006.01)

(52) U.S. Cl.
CPC ...... *H01L 51/5253* (2013.01); *H01L 51/0096* (2013.01); *H01L 27/3244* (2013.01); *H01L 27/3246* (2013.01); *H01L 2227/323* (2013.01)

(58) Field of Classification Search
CPC ............. H01L 51/0096; H01L 51/5253; H01L 27/3244; H01L 27/3246; H01L 2227/323
See application file for complete search history.

(56) References Cited

U.S. PATENT DOCUMENTS 6,894,431 B2  5/2005 Yamazaki et al.
7,524,228 B2  4/2009 Imamura
(Continued)

FOREIGN PATENT DOCUMENTS

JP  2004-14981    1/2004
JP  2009-120924   6/2009
(Continued)

*Primary Examiner* — Peniel M Gumedzoe
(74) *Attorney, Agent, or Firm* — Lewis Roca Rothgerber Christie LLP

(57) ABSTRACT

An organic light-emitting display apparatus includes a display substrate and a thin film encapsulation layer on the display substrate. The display substrate includes at least one hole, a thin film transistor, a light-emitting portion electrically connected to the thin film transistor, and a plurality of insulating layers. The light-emitting portion includes a first electrode, an intermediate layer, and a second electrode. The display substrate includes an active area, an inactive area between the active area and the hole, and a plurality of insulating dams. Each insulating dam includes at least one layer. The inactive area includes a first area different from a laser-etched area and a second laser-etched area.

22 Claims, 13 Drawing Sheets

Related U.S. Application Data continuation of application No. 16/177,617, filed on Nov. 1, 2018, now Pat. No. 10,529,952, which is a continuation of application No. 15/427,693, filed on Feb. 8, 2017, now Pat. No. 10,135,025.

(56) References Cited

U.S. PATENT DOCUMENTS

| | | |
|---|---|---|
| 7,830,591 B2 | 11/2010 | Shimodaira |
| 9,105,871 B2 | 8/2015 | Hamm |
| 9,425,434 B2 | 8/2016 | Lee et al. |
| 9,601,717 B2 | 3/2017 | Lee et al. |
| 9,632,487 B2 | 4/2017 | Kim et al. |
| 2004/0018650 A1 | 1/2004 | Sasajima et al. |
| 2012/0114838 A1 | 5/2012 | Nakagawa et al. |
| 2013/0113368 A1 | 5/2013 | Min |
| 2015/0014650 A1 | 1/2015 | Lim et al. |
| 2015/0091030 A1* | 4/2015 | Lee .................. H01L 51/56 257/91 |
| 2016/0270209 A1 | 9/2016 | Cho |
| 2017/0110532 A1 | 4/2017 | Kim et al. |
| 2017/0288004 A1 | 10/2017 | Kim et al. |

FOREIGN PATENT DOCUMENTS

| | | |
|---|---|---|
| JP | 2009-162552 | 7/2009 |
| JP | 2010-165570 | 7/2010 |
| JP | 2014-96355 | 5/2014 |
| KR | 10-2008-0045637 A | 5/2008 |
| KR | 10-2008-0062168 A | 7/2008 |
| KR | 10-2012-0047809 | 5/2012 |
| KR | 10-2015-0042622 A | 4/2015 |
| KR | 10-2015-0049470 | 5/2015 |
| KR | 10-2015-0072117 | 6/2015 |
| KR | 10-2016-0000853 A | 1/2016 |
| KR | 10-2016-0000980 A | 1/2016 |
| KR | 10-2027289 B1 | 10/2019 |

* cited by examiner

ORGANIC LIGHT-EMITTING DISPLAY APPARATUS AND FABRICATION METHOD THEREOF

CROSS-REFERENCE TO RELATED APPLICATIONS

This application is a continuation of U.S. patent application Ser. No. 16/734,275, filed Jan. 3, 2020, which is a continuation of U.S. patent application Ser. No. 16/177,617, filed Nov. 1, 2018, now U.S. Pat. No. 10,529,952, which is a continuation of U.S. patent application Ser. No. 15/427,693, filed Feb. 8, 2017, now U.S. Pat. No. 10,135,025, which claims priority to and the benefit of Korean Patent Application No. 10-2016-0017771, filed Feb. 16, 2016, the entire content of all of which is incorporated herein by reference.

BACKGROUND

1. Field

One or more embodiments herein relate to an organic light-emitting display apparatus and a method for fabricating an organic light-emitting display apparatus.

2. Description of the Related Art

Smart phones, laptop computers, digital cameras, camcorders, portable information terminals, tablet personal computers, desktop computers, televisions, outdoor advertising billboards, display apparatuses for display, dashboards for vehicles, head-up displays, and other electronic devices have displays. Attempts are continually being made to reduce the thickness of displays. Now, flexible display devices are being made because they are easy to carry and have various shapes.

SUMMARY

In accordance with one or more other embodiments, an organic light-emitting display apparatus includes a display substrate having at least one hole and including a thin film transistor; a light-emitting portion electrically connected to the thin film transistor, the light-emitting portion including a first electrode, an intermediate layer, and a second electrode; and a plurality of insulating layers; and a thin film encapsulation layer on the display substrate, wherein the display substrate includes an active area, an inactive area between the active area and the hole, and a plurality of insulating dams, each including at least one layer, and wherein the inactive area includes a first area different from a laser-etched area and a second laser-etched area.

The insulating dams may be spaced apart and surround the active area. The first area may include the insulating dams, the intermediate layer may be on an outer surface of each of the insulating dams, the second area may be between neighboring insulating dams and an outermost area of the insulating dams, and the second area may exclude the intermediate layer. The second electrode may be on the intermediate layer that is on the outer surface of each of the insulating dams.

The first area may include the insulating dams and an area between neighboring insulating dams, the intermediate layer may be on an outer surface of each of the insulating dams and between the neighboring insulating dams, the second area may include an outermost area of the insulating dams, and the second area may exclude the intermediate layer. The intermediate layers may be on the outer surfaces of the insulating dams and between the neighboring insulating dams are connected to each other. The second electrode may be on the intermediate layer on the outer surface of each of the insulating dams and between the neighboring insulating dams.

The intermediate layer may include an emissive layer at a sub-pixel and a common layer across the active area and the inactive area, and the common layer may be separately arranged in the active and inactive areas. The second electrode may be across the active area and the inactive area, and portions of the second electrode may be separately arranged in the active area and the inactive area. The insulating layer may extend across the active area and the inactive area and includes at least one layer stacked in a direction crossing the display substrate, and the insulating dams may be on the insulating layer.

The thin film transistor may include a semiconductor active layer and a gate electrode, a source electrode, and a drain electrode, the insulating layer may be between the semiconductor active layer and at least one of the gate electrode, the source electrode, or the drain electrode, and the insulating dams may include at least one of a passivation layer covering the thin film transistor, a pixel defining layer defining a sub-pixel including the light-emitting portion, and a spacer on the second electrode.

The apparatus may include a plurality of laser shield layers on at least one insulating layer corresponding to the second laser-etched area in the inactive area. The laser shield layers may be on different insulating layers, and at least part of the laser shield layers may overlap one another. Each of the laser shield layers may include a reflective layer. The hole area may be in and surrounded by the active area.

In accordance with one or more other embodiments, a method for fabricating an organic light-emitting display apparatus includes preparing a display substrate including at least one hole, a thin film transistor, an organic light-emitting device electrically connected to the thin film transistor, and a plurality of insulating layers, the organic light-emitting device includes a first electrode, an intermediate layer, and a second electrode; forming a plurality of insulating dams, each of the insulating dams including at least one layer, the insulating dams formed in an inactive area of the display substrate, the display substrate including an active area and the inactive area between the active area and a hole area including the at least one hole; forming an intermediate layer across the active and inactive areas; selectively forming the second electrode across the active and inactive areas; performing laser etching on an area in the inactive area other than an area including the insulating dams; and forming a thin film encapsulation layer on the display substrate.

The method may include removing the intermediate layer by irradiating a laser beam to at least one area of an area between neighboring insulating dams or an outermost area of the insulating dams, wherein portions of the intermediate layer in the active area and the inactive area may be separated from each other.

The method may include removing the second electrode in an area where the intermediate layer is removed during the laser etching, wherein portions of the second electrode in the active area and the inactive area may be separated from each other. The method may include, after the intermediate layer is formed, selectively forming a second electrode shield layer that shields formation of the second electrode in the inactive area, wherein the second electrode may not be formed in an area including the second electrode shield layer. The method may include forming a plurality of laser shield layers on at least one insulating layer corresponding to the area that is laser etched, wherein a laser beam may be reflected from the laser shield layers.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
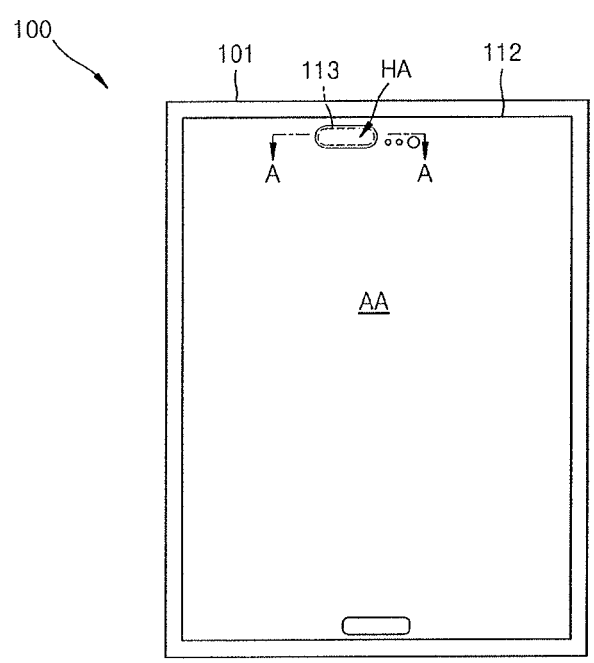
FIG. 1 illustrates an embodiment of a display apparatus.

Example embodiments will now be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
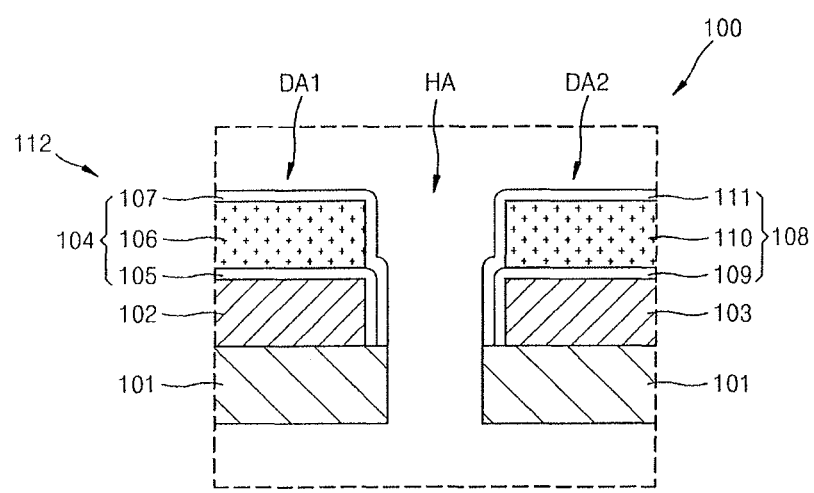
FIG. 2 illustrates a view along section line A-A in FIG. 1.

FIG. 1 illustrates an embodiment of a display apparatus 100, and FIG. 2 illustrates a cross-sectional view taken along line A-A in FIG. 1. Referring to FIGS. 1 and 2, the display apparatus 100 may be an organic light-emitting display apparatus including an active area AA. A hole area HA may be in the active area AA. The hole area HA may be surrounded by the active area AA.

The display apparatus 100 may include a display substrate 101. A plurality of display portions (e.g., first and second display portions 102 and 103) may be on the display substrate 101. A thin film encapsulation (TFE) layer 112 may be on the first and second display portions 102 and 103.

A first display area DA1 and a second display area DA2 may be on the display substrate 101. The first display area DA1 may be connected to the second display area DA2. The hole area HA may be in an area surrounded by the first display area DA1 and the second display area DA2. The first display portion 102 may be in the first display area DA1. A first thin film encapsulation (TFE) layer 104 may be on the first display portion 102. The first TFE layer 104 may include a first inorganic film 105, a first organic film 106 on the first inorganic film 105, and a second inorganic film 107 on the first organic film 106.

The second display portion 103 may be in the second display area DA2. A second thin film encapsulation (TFE) layer 108 may be on the second display portion 103. The second TFE layer 108 may include a first inorganic film 109, a first organic film 110 on the first inorganic film 109, and a second inorganic film 111 on the first organic film 110. In an embodiment, the first display portion 102 may be connected to the second display portion 103. In an embodiment, the first TFE layer 104 may be connected to the second TFE layer 108.

The hole area HA may penetrate through the display substrate 101 and the TFE layer 112. The hole area HA may be in the active area AA including the first display area DA1 and the second display area DA2. An electronic part 113 (e.g., a camera module, a speaker unit, or a sensor such as an illumination sensor or a home button) may be in the hole area HA. In one embodiment, a touch screen, a polarized layer, and/or a cover window may be in the hole area HA.

Figure 3:
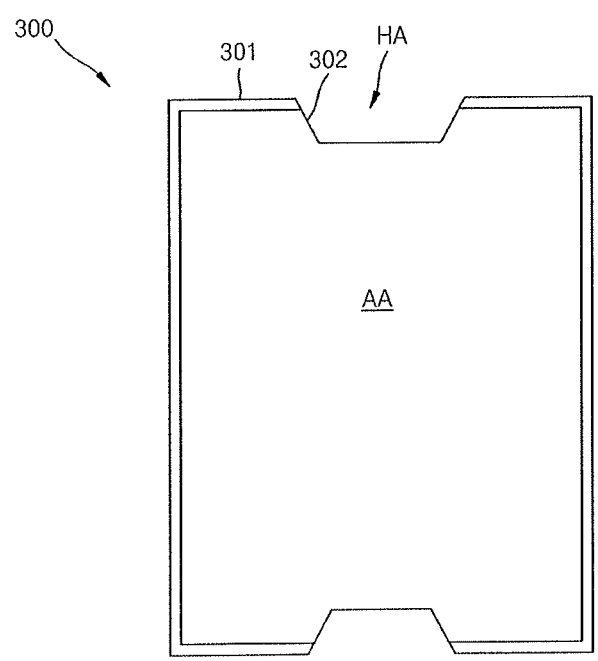
FIG. 3 illustrates another embodiment of a display apparatus.

FIG. 3 illustrates another embodiment of a display apparatus 300. In this embodiment, a portion where the hole area HA is arranged in FIG. 1 is described. A structure of the display apparatus 300 may correspond to the structure of the display apparatus 100 of FIG. 1, except the portion where the hole area HA is arranged.

Referring to FIG. 3, the display apparatus 300 may include a display panel 301, which may include a thin film encapsulation layer covering a display substrate. The active area AA may be on the display panel 301. The cut portion 302 may be arranged in the display panel 301. The cut portion 302 may be formed by cutting at least part of the display panel 301. For example, the cut portion 302 may be formed by cutting partial areas of an upper end and a lower end of the display panel 301.

The hole area HA may be arranged in the upper and lower ends of the display panel 301 due to the cut portion 302. The hole area HA may be an area formed due to the cut portion 302. The hole area HA may penetrate through the display substrate and the thin film encapsulation layer, as in FIG. 2.

The hole area HA is in the active area AA and at least part of the hole area HA may be surrounded by the active area AA. An electronic part such as a camera module, a speaker unit, a sensor, or a button may be arranged in the hole area HA. In one embodiment, a touch screen, a polarized layer, or a cover window may be in the hole area HA.

Figure 4:
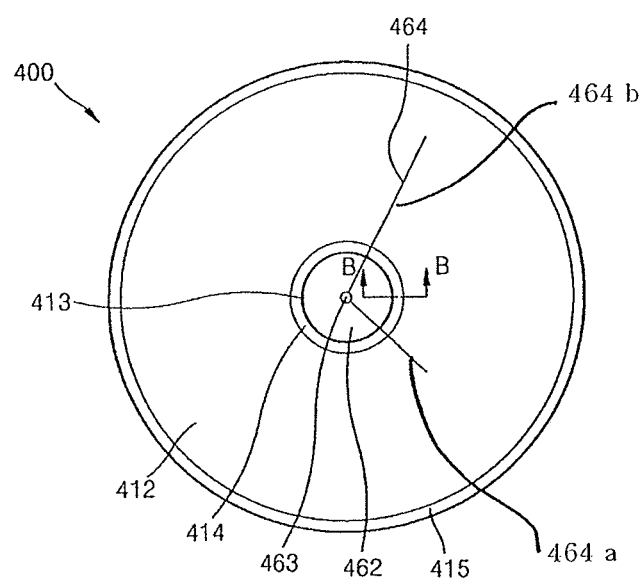
FIG. 4 illustrates another embodiment of a display apparatus.
Figure 5:
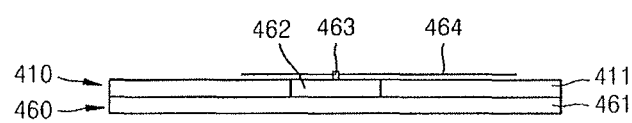
FIG. 5 illustrates a cross-sectional view of the display apparatus in FIG. 4.

FIG. 4 illustrates another embodiment of a structure 400 including a display apparatus 410, and FIG. 5 is a cross-sectional view of FIG. 4. Referring to FIGS. 4 and 5, the structure 400 may include the display apparatus 410 and a mechanical part 460. The display apparatus 410 may be in an upper side. The mechanical part 460 may be located in a lower side. In an embodiment, the mechanical part 460 may be a watch.

The display apparatus 410 may include a display substrate 411. A display portion 412 may be on the display substrate 411. A hole 413 may be at the center of the display substrate 411. The hole 413 may penetrate through the display apparatus 410. The hole 413 may be circular or may have another shape. Only one hole 413 may be arranged at the center of the display apparatus 410. In another embodiment, the display apparatus 410 may include a plurality of holes at the center or another location.

An inactive area (IAA) 414 may be between the display portion 412 and the hole 413. The display portion 412 surround the hole 413. The inactive area 414 may be an area for structural stability of the display apparatus 410 during a process of forming a plurality of devices on the display substrate 411. An inactive area 415 may be further provided at the outermost area of the display substrate 411.

The mechanical part 460 may include a watch main body 461. The display substrate 411 may contact the watch main body 461. A watch shaft 462 may be inserted through the hole 413 of the display substrate 411. An arbor 463 may be placed on the watch shaft 462. A needle indicator 464 such as an hour hand 464*a* and a minute hand 464*b* may be in the arbor 463. The needle indicator 464 on the watch shaft 462 may be above the display substrate 411. The structure 400 may implement a desired screen using the display apparatus 410 and also a highly value-added watch using mechanical part 460.

Figure 6:
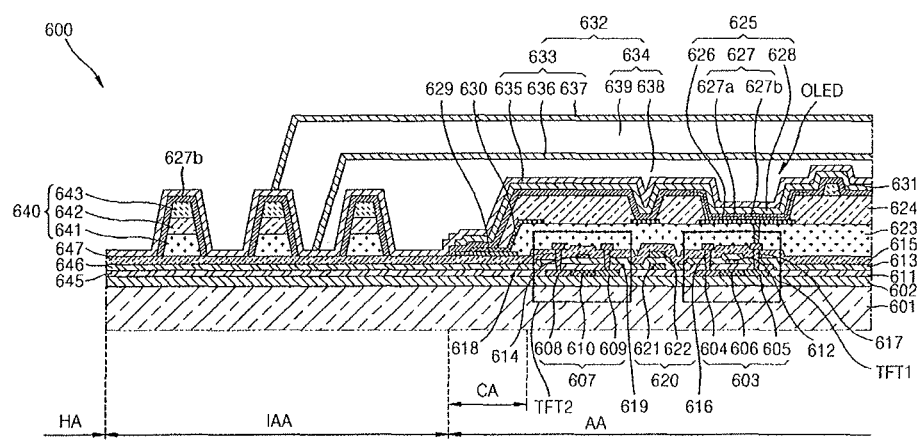
FIG. 6 illustrates a cross-sectional view of a display apparatus according to another embodiment.

FIG. 6 is a cross-sectional view of a part of a display apparatus 600 according to another embodiment. The display apparatus 600 may correspond to a portion cut along a line B-B of the structure 400 in FIG. 4.

Referring to FIG. 6, the display apparatus 600 may include a display substrate 601 and a TFE layer 632 covering the display substrate 601. The display substrate 601 may include the active area AA for display an image and the inactive area IAA extending to the outside of active area AA. The active area AA may include a circuit area (CA). The inactive area IAA surrounds the active area AA.

The hole area HA may be outside the inactive area IAA. The hole area HA may correspond to the hole area HA of FIGS. 1 to 5 where the hole is arranged. The inactive area IAA may be between the active area AA and the hole area HA.

The display substrate 601 may be a glass substrate, a polymer substrate, a flexible film, a metal substrate, or a composite substrate thereof. The display substrate 601 may be transparent, opaque, or semitransparent. In an embodiment, the display substrate 601 may be a polymer material such as polyimide (PI), polycarbonate (PC), polyethersulphone (PES), polyethylene terephthalate (PET), polyethylenenaphthalate (PEN), polyarylate (PAR), and fiber glass reinforced plastic (FRP).

A barrier layer 602 may be on the display substrate 601. The barrier layer 602 may cover an entire upper surface of the display substrate 601. The barrier layer 602 may be formed of an inorganic material or an organic material. The barrier layer 602 may be a single-layer film or a multilayer film.

In the active area AA, a plurality of thin film transistors (TFTs) may be on the barrier layer 602. The TFTs may be in an area for display an image and an area where a circuit pattern is formed. In the present embodiment, two TFTs are arranged on the display substrate 601. The number and/or type of the TFTs may different in another embodiment.

In one embodiment, a first thin film transistor TFT1 may include a first semiconductor active layer 603, a first gate electrode 612, a first source electrode 616, and a first drain electrode 617. The first semiconductor active layer 603 may include a source region 604 and a drain region 605 with doped N-type impurity ions or P-type impurity ions. A channel region 606 that is not doped with impurities may be between the source region 604 and the drain region 605. A first gate insulating film 611 may be between the first semiconductor active layer 603 and the first gate electrode 612. The first semiconductor active layer 603 may be insulated from the first gate electrode 612.

The second thin film transistor TFT2 may include a second semiconductor active layer 607, a second gate electrode 614, a second source electrode 618, and a second drain electrode 619. The second semiconductor active layer 607 may include a source region 608, a drain region 609, and a channel region 610. The first gate insulating film 611 and a second gate insulating film 613 may be between the second semiconductor active layer 607 and the second gate electrode 614. The second semiconductor active layer 607 may be insulated from the second gate electrode 614. The first gate insulating film 611 and the second gate insulating film 613 may be stacked in a direction crossing the display substrate 601.

The first gate electrode 612 and the second gate electrode 614 may not be on the same layer by the first gate insulating film 611 and the second gate insulating film 613. Accordingly, even when the first thin film transistor TFT1 and the second thin film transistor TFT2 are arranged close to each other, the first gate electrode 612 and the second gate electrode 614 may reduce mutual interference and more devices may be arranged in the same area on the display substrate 601.

The first gate insulating film 611 and the second gate insulating film 613 may be formed of the same material. In an embodiment, the first gate insulating film 611 and the second gate insulating film 613 may be inorganic films.

The first gate electrode 612 and the second gate electrode 614 may be formed of the same material. In an embodiment, the first gate electrode 612 and the second gate electrode 614 may include a metal member exhibiting superior conductivity. For example, the first gate electrode 612 and the second gate electrode 614 may be formed of a metal material such as Au, Ag, Cu, Ni, Pt, Pd, Al, Mo, or Cr. In another embodiment, the first gate electrode 612 and the second gate electrode 614 may be formed of an alloy such as Al:Nd or Mo:W. The first gate electrode 612 and the second gate electrode 614 may include a single film or a multilayer film.

An interlayer insulating film 615 may be on the second gate electrode 614. The interlayer insulating film 615 may include an inorganic material or an organic material.

The first source electrode 616 and the first drain electrode 617 may be arranged on the interlayer insulating film 615. The first source electrode 616 and the first drain electrode 617 may be connected to the first semiconductor active layer 603 via contact holes. Also, the second source electrode 618 and the second drain electrode 619 may be on the interlayer insulating film 615. The second source electrode 618 and the second drain electrode 619 may be connected to the second semiconductor active layer 607 via contact holes.

The first source electrode 616, the first drain electrode 617, the second source electrode 618, and the second drain electrode 619 may be formed of the same material. In an embodiment, the first source electrode 616, the first drain electrode 617, the second source electrode 618, the second drain electrode 619 may be formed of metal, an alloy, a metal nitride, a conductive metal oxide, or a transparent conductive material.

A capacitor 620 may be on the display substrate 601. In one embodiment, a plurality of capacitors 620 may be included. The capacitor 620 may include the second gate insulating film 613 between a first capacitor electrode 621 and a second capacitor electrode 622. The first capacitor electrode 621 may be formed of the same material as the first gate electrode 612. The second capacitor electrode 622 may be formed of the same material as the second gate electrode 614.

A passivation layer 623 may cover the thin film transistors TFT1 and TFT2 and the capacitor 620. The passivation layer 623 may be on the interlayer insulating film 615 and may be formed of an inorganic material or an organic material.

The first thin film transistor TFT1 may be electrically connected to an organic light emitting device (OLED) 625 that is a light-emitting portion for displaying an image. The OLED 625 may be arranged on the passivation layer 623.

The OLED 625 may include a first electrode 626, an intermediate layer 627, and a second electrode 628. The first electrode 626 functions as an anode and may include various conductive materials. The first electrode 626 may include a transparent electrode or a reflective electrode. For example, when the first electrode 626 is a transparent electrode, the first electrode 626 may be a transparent conductive film. When the first electrode 626 is a reflective electrode, the first electrode 626 may include a reflective film and a transparent conductive film on the reflective film.

A pixel defining layer 624 may be on the passivation layer 623. The pixel defining layer 624 may cover part of the first electrode 626. The pixel defining layer 624 defines a light-emitting area of each sub-pixel by surrounding the first electrode 626 along an edge thereof. The first electrode 626 may be patterned for each sub-pixel. The pixel defining layer 624 may include an organic material or an inorganic material. The pixel defining layer 624 may include a single-layer film or multilayer film.

The intermediate layer 627 may be in an area where the first electrode 626 is exposed, by etching part of the pixel defining layer 624. The intermediate layer 627 may include an emissive layer 627a and a common layer 627b. The emissive layer 627a may be at each sub-pixel. The common layer 627b may be across the active area AA and the inactive area IAA. The common layer 627b may include at least one of a hole injection layer (HIL), a hole transport layer (HTL), an electron transport layer (ETL), or an electron injection layer (EIL). In an embodiment, the intermediate layer 627 may include the emissive layer 627a and further include other various functional layers.

The second electrode 628 may function as a cathode arranged across the active area AA and the inactive area IAA. The second electrode 628 may include a transparent electrode or a reflective electrode. For example, when the second electrode 628 may be a transparent electrode, the second electrode 628 may include a conductive layer including metal having a small work function and a compound thereof and a transparent conductive film on the conductive layer and formed of a material for a transparent electrode. When the second electrode 628 is a reflective electrode, the second electrode 628 may include a conductive layer that includes metal and a compound thereof.

In an embodiment, a spacer 631 may be on the pixel defining layer 624 along an edge of a sub-pixel. The spacer 631 may be between neighboring sub-pixels. The common layer 627b and the second electrode 628 may be stacked on an outer surface of the spacer 631.

In an embodiment, a plurality of sub-pixels may be arranged on the display substrate 601. For example, a red, green, blue, or white color may be implemented by each sub-pixel.

Various circuit patterns may be in the circuit area CA. For example, various circuit patterns such as a power supply pattern or an anti-static electricity pattern may be arranged in the circuit area CA. A power wiring 629 may be on the interlayer insulating film 615. The power wiring 629 may be a wiring to which power is externally applied. The power wiring 629 may be formed of the same material as the first source electrode 616, the first drain electrode 617, the second source electrode 618, and the second drain electrode 619. In an embodiment, the power wiring 629 may be a triple structure of titanium (Ti)/aluminum (Al)/titanium (Ti).

A circuit wiring 630 may be on the passivation layer 623. The circuit wiring 630 may be formed of the same material as the first electrode 626. The power wiring 629 and the circuit wiring 630 may be on different layers. One end of the circuit wiring 630 may contact the power wiring 629. At least part of the circuit wiring 630 may overlap the power wiring 629. One end of the common layer 627b may be on the circuit wiring 630. The second electrode 628 may be on the one end of the common layer 627b.

The TFE layer 632 may be above the display substrate 601. The TFE layer 632 may cover the active area AA. Also, the TFE layer 632 may cover at least part of the inactive area IAA. The TFE layer 632 may include a plurality of inorganic films 633 and a plurality of organic films 634 that are alternately stacked. For example, the inorganic film 633 may include a first inorganic film 635, a second inorganic film 636, and a third inorganic film 637. The organic film 634 may include a first organic film 638 and a second organic film 639.

In the inactive area IAA, the barrier layer 602 may be on the display substrate 601. The barrier layer 602 may extend across the active area AA and the inactive area IAA. First to third insulating layers 645 to 647 having at least one layer in the direction crossing the display substrate 601 may be on the barrier layer 602. The first to third insulating layers 645 to 647 may be stacked in the direction crossing the display substrate 601.

In an embodiment, the first to third insulating layers 645 to 647 may extend across the active area AA and the inactive area IAA. The first insulating layer 645 may be on the barrier layer 602. The first insulating layer 645 may be on the same layer as the first gate insulating film 611. The first insulating layer 645 may be formed with the first gate insulating film 611 in the same process. The first insulating layer 645 may be formed of the same material as the first gate insulating film 611.

The second insulating layer 646 may be on the first insulating layer 645. The second insulating layer 646 may be on the same layer as the second gate insulating film 613. The second insulating layer 646 may be formed with the second gate insulating film 613 in the same process. The second insulating layer 646 may be formed of the same material as the second gate insulating film 613.

The third insulating layer 647 may be arranged on the second insulating layer 646. The third insulating layer 647 may be on the same layer as the interlayer insulating film 615. The third insulating layer 647 may be formed with the interlayer insulating film 615 in the same process. The third insulating layer 647 may be formed of the same material as the interlayer insulating film 615.

When the organic film 634 in the TFE layer 632 is above the display substrate 601, an insulating dam 640 may be in at least one layer in the inactive area IAA to prevent an organic material in a liquid state from flowing in a direction toward an undesirable area of the display substrate 601. The insulating dam 640 may surround the active area AA. In one embodiment, a plurality of insulating dams 640 may be spaced apart a certain distance from one another.

The insulating dam 640 may be a single layer or a multilayer. The insulating dam 640 may include a first insulating dam 641, a second insulating dam 642 on the first insulating dam 641, and a third insulating dam 643 on the second insulating dam 642. In an embodiment, the insulating dam 640 may have, for example, a trilayer structure.

The first insulating dam 641 may be on the third insulating layer 647. The first insulating dam 641 may be on the same layer as the passivation layer 623. The first insulating dam 641 may be formed with the passivation layer 623 in the same process. The first insulating dam 641 may include the same material as the passivation layer 623.

The second insulating dam 642 may be on the first insulating dam 641. The second insulating dam 642 may be on the same layer as the pixel defining layer 624. The second insulating dam 642 may be formed with the pixel defining layer 624 in the same process. The second insulating dam 642 may be formed of the same material as the pixel defining layer 624.

The third insulating dam 643 may be on the second insulating dam 642. The third insulating dam 643 may be formed with the spacer 631 in the same process. The third insulating dam 643 may be formed of the same material as the spacer 631.

During manufacturing of the display apparatus 600, the intermediate layer 627 in the OLED 625 (e.g., the common layer 627b of at least one of the HIL, the HTL, the ETL, or the EIL) and the second electrode 628 are deposited on an entire surface from the active area AA to the inactive area IAA according to a pattern shape of a deposition mask. The common layer 627b and the second electrode 628 in the inactive area IAA may be removed before the TFE layer 632 is formed. This is because the common layer 627b including an organic material and the second electrode 628 including a metal layer are relatively weak at moisture and oxygen.

If the common layer 627b and the second electrode 628 directly cover an upper surface of the third insulating layer 647, during the formation of the hole area HA, moisture and oxygen may intrude into the active area AA through the common layer 627b and the second electrode 628. Accordingly, the common layer 627b and the second electrode 628 in the inactive area IAA are removed and then the TFE layer 632 may be formed on the display substrate 601. In contrast, since the common layer 627b on the outer surface of each of the insulating dams 640 does not cover the upper surface of the third insulating layer 647, the common layer 627b may not be removed.

The common layer 627b and the second electrode 628 in the inactive area IAA may be removed by irradiating a laser beam from a laser apparatus. When a laser etching process is performed, the common layer 627b and the second electrode 628 may be easily removed.

The insulating dam 640 may be damaged by a laser beam. Accordingly, except an area where the insulating dam 640 is formed, the laser etching process may be selectively performed on the inactive area IAA.

In an embodiment, the inactive area IAA may include a first area that is not laser etched and a second area that is laser etched. The first area may correspond to an area where each of the insulating dams 640 is arranged. The common layer 627b may be on an outer surface of each of the insulating dams 640. Since the common layer 627b on the outer surface of each of the insulating dams 640 does not cover the upper surface of the third insulating layer 647, the common layer 627b may not be removed to improve an efficiency of the laser etching process.

The second area may correspond to an area between the neighboring insulating dams 640 and an outermost area of the insulating dams 640. A laser beam is irradiated onto the area between the neighboring insulating dams 640 and the outermost area of the insulating dams 640 so that the common layer 627b may not be arranged.

After a TFE process, since the common layer 627b is not in the area between the neighboring insulating dams 640 and the outermost area of the insulating dams 640, the intrusion of moisture and oxygen into the active area AA through the common layer 627b may be prevented.

In an embodiment, the second electrode 628 may be further arranged on the outer surface of each of the insulating dams 640. The second electrode 628 may be arranged on the common layer 627b. In an embodiment, a second electrode shield layer 751 in FIGS. 7A to 7C may be further arranged on the outer surface of each of the insulating dams 640.

Figure 7A:
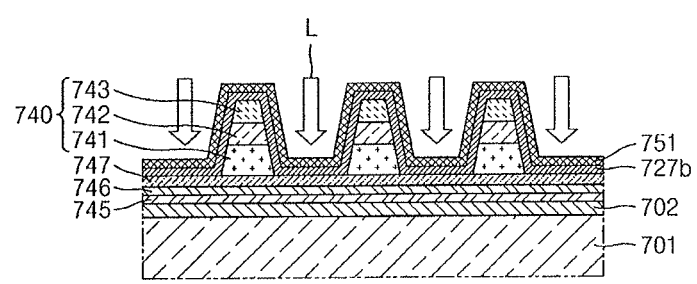
FIG. 7A illustrates an embodiment of an operation for performing laser etching on a display substrate.
Figure 7B:
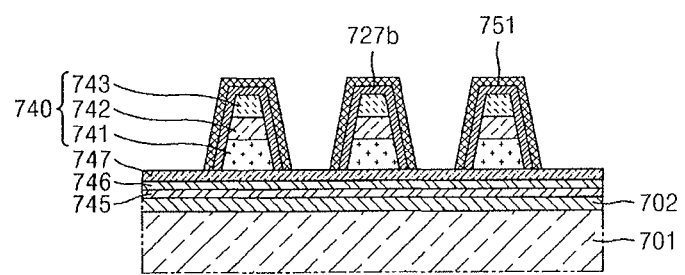
FIG. 7B illustrates a state of the display substrate after laser etching.
Figure 7C:
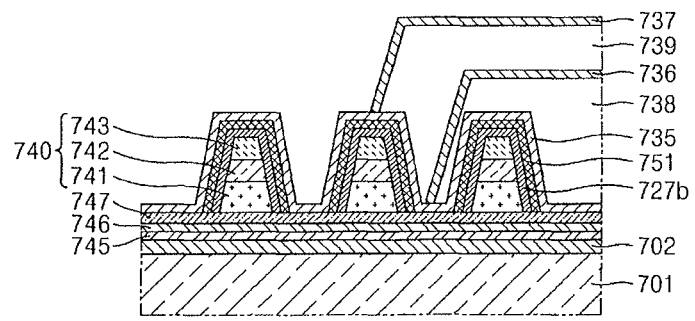
FIG. 7C illustrates an embodiment of a thin film encapsulation layer on the display substrate of FIG. 7B.

FIGS. 7A to 7C are cross-sectional views showing operations of one embodiment of a laser etching process performed on a display substrate 701. Referring to FIG. 7A, the display substrate 701 is prepared. A barrier layer 702, a first insulating layer 745, a second insulating layer 746, and a third insulating layer 747 are sequentially formed on and above the display substrate 701. An insulating dam 740 is formed on the third insulating layer 747. For example, a first insulating dam 741 is formed on the third insulating layer 747, a second insulating dam 742 is formed on the first insulating dam 741, and a third insulating dam 743 is formed on the second insulating dam 742. In one embodiment, a plurality of insulating dams 740 may be arranged spaced apart from each other above the display substrate 701.

Next, a common layer 727b in the intermediate layer 627 (e.g., see FIG. 6) is formed across the active area AA and the inactive area IAA. In the inactive area IAA, the common layer 727b is formed on both of an upper surface of the third insulating layer 747 and an outer surface of the insulating dam 740. In an embodiment, an emissive layer in the intermediate layer 627 may be patterned on each sub-pixel arranged in the active area AA.

Next, the second electrode shield layer 751 is selectively formed on the common layer 727b. The second electrode shield layer 751 functions as a mask with respect to the second electrode 628 (e.g., see FIG. 6). The second electrode shield layer 751 may be formed of various materials to prevent the formation of the second electrode 628. The second electrode shield layer 751 may include a material that is not mixed with the second electrode 628, for example, an organic material. In an embodiment, the second electrode shield layer 751 may be a blue host used for the intermediate layer 627.

Next, the second electrode 628 is selectively formed across the active area AA and the inactive area IAA. The second electrode 628 is formed in an area other than the area where the second electrode shield layer 751 is formed. For example, the second electrode 628 may be entirely formed in the active area AA where the second electrode shield layer 751 does not exist. The second electrode 628 is not formed in the inactive area IAA where the second electrode shield layer 751 exists.

Next, a laser beam L is irradiated to the area other than the area where the insulating dam 740 is arranged, e.g., the area between the neighboring insulating dams 740 and the outermost area of the insulating dams 740. Accordingly, the common layer 727b is removed by the laser etching. In an embodiment, the second electrode shield layer 751 may be simultaneously removed when the common layer 727b is removed. In another embodiment, the second electrode shield layer 751 may be separately removed by a heating device prior to the removal of the common layer 727b.

Referring to FIG. 7B, the common layer 727b is not formed in the area between the neighboring insulating dams 740, except the area where the insulating dams 740 are formed, and the outermost area of the insulating dams 740, above the display substrate 701. Also, the common layer 727b in the active area AA and the inactive area IAA may be separated from each other to prevent the intrusion of moisture and oxygen into the active area AA, as in FIG. 6.

Referring to FIG. 7C, a first inorganic film 735, a first organic film 738, a second inorganic film 736, a second organic film 739, and a third inorganic film 737 are sequentially stacked on and above the display substrate 701. In the inactive area IAA, the second electrode 628 may be formed on the common layer 727b when the second electrode shield layer 751 does not exist. The second electrode 628 may be selectively removed with the common layer 727b by the laser etching.

Figure 8:
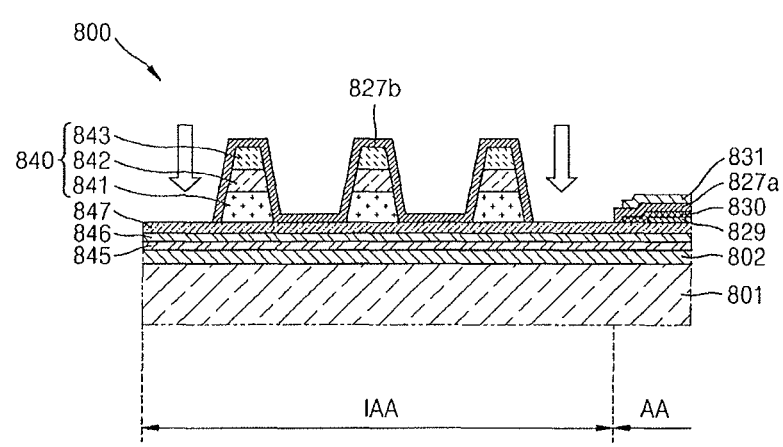
FIG. 8 illustrates another embodiment of a display apparatus.

FIG. 8 is a cross-sectional view of a part of another embodiment of a display apparatus 800. Referring to FIG. 8, the display apparatus 800 may include a display substrate 801. The display substrate 801 may include the active area AA and the inactive area IAA. The hole area HA may be in the display substrate 801. A barrier layer 802 may be on the display substrate 801. A first insulating layer 845 may be on the barrier layer 802. A second insulating layer 846 may be on the first insulating layer 845. A third insulating layer 847 may be on the second insulating layer 846. The barrier layer 802, the first insulating layer 845, the second insulating layer 846, and the third insulating layer 847 may extend across the active area AA and the inactive area IAA.

In the active area AA, a power wiring 829 may be on the third insulating layer 847. A circuit wiring 830 may be on the power wiring 829. A common layer 827a in the intermediate layer 627 may be on the circuit wiring 830. A second electrode 831 may be on the common layer 827a.

In the inactive area IAA, an insulating dam 840 may be on the third insulating layer 847. The insulating dam 840 may include a first insulating dam 841, a second insulating dam 842 on the first insulating dam 841, and a third insulating dam 843 on the second insulating dam 842. The insulating dam 840 may have, for example, a trilayer structure.

The inactive area IAA may include a first area that is not laser etched and a second area that is laser etched. The first area may correspond to an area where the insulating dam 840 is arranged and an area between the neighboring insulating dams 840. A common layer 827b may be on an outer surface of the insulating dam 840 and the neighboring insulating dams 840. The common layer 827b on the outer surface of the insulating dam 840 may be connected to the neighboring insulating dams 840.

The second area may correspond to the outermost area of the insulating dams 840. The common layer 827b may not be formed by laser etching in the outermost area of the insulating dams 840. In an embodiment, the common layer 827a in the active area AA and the common layer 827b in the inactive area IAA may be separated from each other. The second electrode 831 may not be formed in the inactive area IAA.

As such, in the inactive area IAA, since the common layer 827a and the second electrode 831 do not exist in the outermost area of the insulating dams 840, which is laser etched, except the area where the insulating dam 840 is arranged and the area between the neighboring insulating dams 840, which are not laser etched, the intrusion of moisture and oxygen into the active area AA may be prevented.

Figure 9:
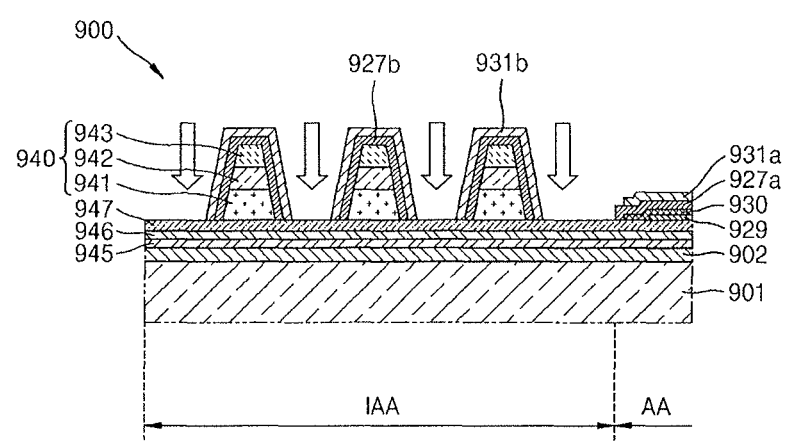
FIGS. 9 to 11 illustrate additional embodiments of display apparatuses.

FIG. 9 is a cross-sectional view of a part of another embodiment of a display apparatus 900. Referring to FIG. 9, the display apparatus 900 may include a display substrate 901 having the active area AA and the inactive area IAA. A barrier layer 902, a first insulating layer 945, a second insulating layer 946, and a third insulating layer 947 may be stacked on and above the display substrate 901. The barrier layer 902, the first insulating layer 945, the second insulating layer 946, and the third insulating layer 947 may extend across the active area AA and the inactive area IAA.

In the active area AA, a power wiring 929, a circuit wiring 930, a common layer 927a, and a second electrode 931a may be stacked on and above the display substrate 901. The stacked portion may correspond to a circuit area.

In the inactive area IAA, a plurality of insulating dams 940 may be on the third insulating layer 947. Each of the insulating dams 940 may include a first insulating dam 941, a second insulating dam 942 on the first insulating dam 941, and a third insulating dam 943 on the second insulating dam 942. The inactive area IAA may include a first area that is not laser etched and a second area that is laser etched.

The first area may correspond to an area where the insulating dams 940 are arranged. A common layer 927b may be on an outer surface of each of the insulating dams 940. In an embodiment, a second electrode 931b may be on common layer 927b.

The second area may correspond to an area between the neighboring insulating dams 940 and an outermost area of the insulating dams 940. The common layer 927b and second electrode 931b may not be in the area between the neighboring insulating dams 940 and the outermost area of the insulating dams 940 by the laser etching.

In an embodiment, the common layer 927a in the active area AA and the common layer 927b in the inactive area IAA may be separated from each other. In an embodiment, the second electrode 931a in the active area AA and the second electrode 931b in the inactive area IAA may be separated from each other.

As such, in the inactive area IAA, since the common layer 927b and the second electrode 931b are not in the area between the neighboring insulating dams 940 and the outermost area of the insulating dam 940, which are laser etched, except the area where the insulating dams 940 are arranged, which is not laser etched, the intrusion of moisture and oxygen into the active area AA may be prevented.

Figure 10:
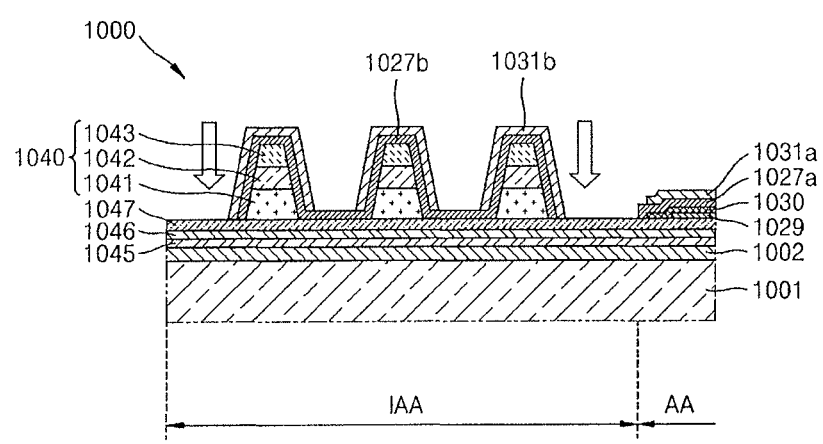

FIG. 10 is a cross-sectional view of a part of another embodiment of a display apparatus 1000. Referring to FIG. 10, the display apparatus 1000 may include a display substrate 1001 having the active area AA and the inactive area IAA. The display apparatus 1000 may include the hole area HA.

A barrier layer 1002, a first insulating layer 1045, a second insulating layer 1046, and a third insulating layer 1047 may be stacked on and above the display substrate 1001. The barrier layer 1002, the first insulating layer 1045, the second insulating layer 1046, and the third insulating layer 1047 may extend across the active area AA and the inactive area IAA.

In the active area AA, a power wiring 1029, a circuit wiring 1030, a common layer 1027a may be in the intermediate layer 627, and a second electrode 1031a may be stacked on and above the third insulating layer 1047. A stack structure may be in a circuit area to which power is supplied.

In the inactive area IAA, an insulating dam 1040 may be on the third insulating layer 1047. The insulating dam 1040 may include a first insulating dam 1041, a second insulating dam 1042 on the first insulating dam 1041, and a third insulating dam 1043 on the second insulating dam 1042.

The inactive area IAA may include a first area that is not laser etched and a second are that is laser etched. The first are may correspond to the area where the insulating dam 1040 is arranged and the area between the neighboring insulating dams 1040. A common layer 1027b may be on an outer surface of the insulating dam 1040 and between the neighboring insulating dams 1040. The common layer 1027b on the outer surface of the insulating dam 1040 and between the neighboring insulating dams 1040 may be connected to each other.

A second electrode 1031b may be on the common layer 1027b. The second electrode 1031b may be on the outer surface of the insulating dam 1040 and between the neighboring insulating dams 1040.

The second area may correspond to the outermost area of the insulating dams 1040. The common layer 1027b and the second electrode 1031b may not be formed in the outermost area of the insulating dams 1040 by the laser etching.

In an embodiment, the common layer 1027a in the active area AA and the common layer 1027b in the inactive area IAA may be separated from each other. In an embodiment, the second electrode 1031a in the active area AA and the second electrode 1031b in the inactive area IAA may be separated from each other.

As such, in the inactive area IAA, since the common layer 1027a and the second electrode 1031b are not formed in the outermost area of the insulating dam 1040, which is laser etched, except for the area where the insulating dam 1040 is arranged and the area between the neighboring insulating dams 1040, which are not laser etched, the intrusion of moisture and oxygen into the active area AA may be prevented.

During the laser etching, a laser beam may have a bad influence on the display substrates 601 to 1001. The display substrates 601 to 1001 may be protected from the laser beam. Accordingly, in the inactive area IAA, a plurality of laser shield layers may be arranged on at least one of the insulating layers corresponding to the area between the neighboring insulating dams.

Figure 11:
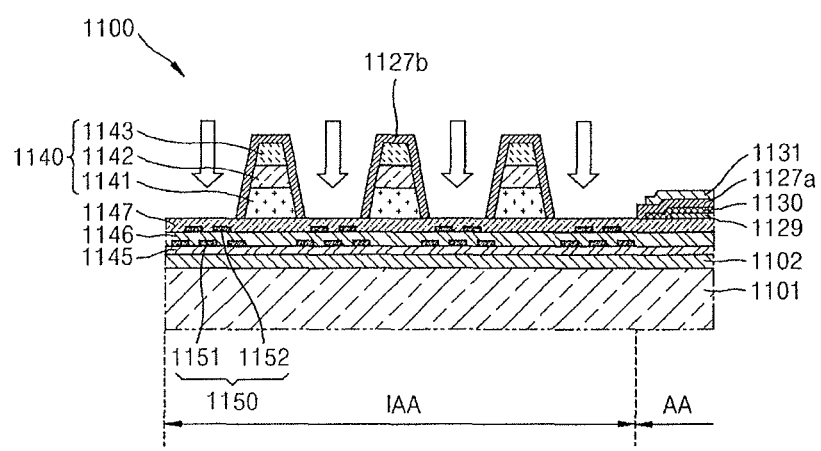

FIG. 11 illustrates another embodiment of a display apparatus 1100 which may include a display substrate 1101 having the active area AA and the inactive area IAA. A barrier layer 1102, a first insulating layer 1145, a second insulating layer 1146, and a third insulating layer 1147 may be arranged on and above the display substrate 1101.

In the active area AA, a power wiring 1129, a circuit wiring 1130, a common layer 1127a may be provided on the intermediate layer 627, and a second electrode 1131 may be stacked on and above the third insulating layer 1147. A stack structure may be arranged in a circuit area.

In the inactive area IAA, an insulating dam 1140 may be arranged on the third insulating layer 1147. The insulating dam 1140 may include a first insulating dam 1141, a second insulating dam 1142 on the first insulating dam 1141, and a third insulating dam 1143 on the second insulating dam 1142. The inactive area IAA may include a first are that is not laser etched and a second area that is laser etched.

The first area may correspond to an area where the insulating dam 1140 is arranged. A common layer 1127b may be on an outer surface of the insulating dam 1140.

The second area may correspond to an area between the neighboring insulating dams 1140 and an outermost area of the insulating dams 1140. The common layer 1127b may not be in the area between the neighboring insulating dams 1140, and the outermost area of the insulating dams 1140 by the laser etching. In an embodiment, a common layer 1127a in the active area AA and the common layer 1127b in the inactive area IAA may be separated from each other. In an embodiment, a second electrode 1131 may not be in the inactive area IAA.

A plurality of laser shield layers 1150 may be in the inactive area IAA. The laser shield layers 1150 may be in the area that is laser etched. In an embodiment, the laser shield layers 1150 may be on at least one of the first to third insulating layers 1145 to 1147 corresponding to the area between the neighboring insulating dams 1140 and the outermost area of the insulating dams 1140.

A plurality of first laser shield layers 1151 may be spaced apart from one another on the first insulating layer 1145. The first laser shield layer 1151 may be arranged corresponding to the area between the neighboring insulating dams 1140 and the outermost area of the insulating dams 1140. The first laser shield layer 1151 may be on the same layer as the first gate electrode 612 of FIG. 6. The first laser shield layer 1151 may be formed with the first gate electrode 612 in the same process. The first laser shield layer 1151 may be formed of the same material as the first gate electrode 612.

A plurality of second laser shield layers 1152 may be on the second insulating layer 1146. The second laser shield layers 1152 may be spaced apart from one another. The second laser shield layers 1152 may correspond to the area between the neighboring insulating dams 1140 and the outermost area of the insulating dams 1140.

The second laser shield layers 1152 may be on the same layer as the second gate electrode 614 of FIG. 6. The second laser shield layers 1152 may be formed with the second gate electrode 614 in the same process. The second laser shield layers 1152 may be formed of the same material as the second gate electrode 614.

The first laser shield layers 1151 and the second laser shield layers 1152 may include a reflective material to prevent damage of the display substrate 1101 due to a laser beam during the laser etching process. For example, the first laser shield layers 1151 and the second laser shield layers 1152 may be reflective layers having a thin thickness and formed of a metal material. The first laser shield layers 1151 and the second laser shield layers 1152 may not be electrically connected to the active area AA. In an embodiment, a certain power may not be applied to the first laser shield layers 1151 and the second laser shield layers 1152.

In an embodiment, the first laser shield layers 1151 and the second laser shield layers 1152 may overlap each other. For example, the first laser shield layers 1151 may be on the first insulating layer 1145 and spaced apart from one another. The second laser shield layers 1152 may be on the second insulating layer 1146 and spaced apart from one another. The first laser shield layers 1151 and the second laser shield layers 1152 may be at least partially overlap each other in the direction crossing the display substrate 1101.

Accordingly, during the laser etching process, even when a laser beam is irradiated onto the display substrate 1101, the laser beam is reflected by the first laser shield layers 1151 and second laser shield layers 115, which overlap each other. Thus, the laser beam may not intrude into the display substrate 1101. In another embodiment, a laser shield layer may be selectively formed in an area to which a laser beam is irradiated. For example, a laser shield layer may be formed on an outer surface of the insulating dam 1140 to prevent damage to the insulating dam 1140.

In accordance with one or more of the aforementioned embodiments, laser etching is selectively performed in an inactive area close to a hole area. As a result, the efficiency of a method for manufacturing an organic light-emitting display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a substrate including a front surface and a rear surface, the substrate having a hole that passes from the front surface to the rear surface;
    an organic light-emitting element in an active area, the organic light-emitting element comprising a first electrode, a second electrode, and an emissive layer between the first electrode and the second electrode;
    a first dam and a second dam located in an inactive area between the active area and the hole;
    a first inorganic layer over the second electrode of the organic light-emitting element;
    an organic layer over the first inorganic layer, the organic layer covering at least a part of a top surface of the first dam that is closer to the active area than the second dam; and
    a second inorganic layer over the organic layer, a second portion of the second inorganic layer being in direct contact with a first portion of the first inorganic layer in a region between the first dam and the second dam.

2. The organic light-emitting display apparatus of claim 1, wherein each of the first dam and the second dam comprises a top surface and a bottom surface, and a width of the bottom surface is greater than that of the top surface.

3. The organic light-emitting display apparatus of claim 1, wherein an edge of at least one of the first inorganic layer or the second inorganic layer is closer to the hole than an edge of the organic layer.

4. The organic light-emitting display apparatus of claim 3, further comprising:
    an upper organic layer over the second inorganic layer, wherein an edge of the upper organic layer is closer to the hole than the edge of the organic layer.

5. The organic light-emitting display apparatus of claim 4, wherein a portion of the upper organic layer covers the region in which the second portion of the second inorganic layer and the first portion of the first inorganic layer are in direct contact with each other.

6. The organic light-emitting display apparatus of claim 4, wherein a top surface of the upper organic layer is substantially flat.

7. The organic light-emitting display apparatus of claim 1, further comprising:
    a common layer between the first electrode and the second electrode, a portion of the common layer overlapping the first dam or the second dam.

8. The organic light-emitting display apparatus of claim 7, wherein the common layer comprises a hole injection layer, a hole transport layer, an electron transport layer, or an electron injection layer.

9. The organic light-emitting display apparatus of claim 1, further comprising:
    a passivation layer below the first electrode and comprising an organic material;
    a pixel defining layer covering edges of the first electrode; and
    a spacer over the pixel defining layer.

10. The organic light-emitting display apparatus of claim 9, wherein each of the first and second dams comprises a material that is the same as a material of the passivation layer.

11. The organic light-emitting display apparatus of claim 1, further comprises a plurality of metal patterns spaced apart from each other, wherein the plurality of metal patterns are located between the second dam and the hole.

12. The organic light-emitting display apparatus of claim 11, wherein the plurality of metal patterns comprises Au, Ag, Cu, Ni, Pt, Pd, Al, Mo, or Cr.

13. An organic light-emitting display apparatus, comprising:
    a substrate having a hole;
    an organic light-emitting element in an active area, the organic light-emitting element comprising a first electrode, a second electrode, and an intermediate layer between the first electrode and the second electrode;
    a first dam and a second dam located in an inactive area between the active area and the hole;
    a first inorganic layer over the second electrode of the organic light-emitting element;
    a first organic layer over the first inorganic layer;
    a second inorganic layer over the first organic layer; and
    a second organic layer over the second inorganic layer,
    wherein the first inorganic layer and the second inorganic layer contact each other in the inactive area; and
    wherein the first dam is closer to the active area than the second dam, the first organic layer at least partly covers the first dam, and the second organic layer extends further to the hole beyond the first organic layer and at least partly covers the second dam in a plan view.

14. The organic light-emitting display apparatus of claim 13, wherein a contact region of the first inorganic layer and the second inorganic layer is between the first dam and the second dam.

15. The organic light-emitting display apparatus of claim 13, wherein an edge of the first organic layer adjacent to the hole is spaced apart from the hole.

16. The organic light-emitting display apparatus of claim 13, wherein the intermediate layer comprises an emissive layer and a common layer, the common layer comprising portions that are separated from each other in the inactive area, and
    wherein the second electrode comprises portions that are separated from each other in the inactive area.

17. The organic light-emitting display apparatus of claim 13, further comprising:

a passivation layer below the first electrode and comprising an organic material;

a pixel defining layer covering edges of the first electrode; and a spacer over the pixel defining layer, wherein each of the first and second dams comprises a material that is the same as a material of the passivation layer.

18. An organic light-emitting display apparatus, comprising:

a substrate having a hole;

an organic light-emitting element in an active area, the organic light-emitting element comprising a first electrode, a second electrode, and an intermediate layer between the first electrode and the second electrode;

a first dam and a second dam located in an inactive area between the active area and the hole, the first dam being closer to the active area than the second dam;

a first inorganic layer over the second electrode of the organic light-emitting element;

a first organic layer over the first inorganic layer;

a second inorganic layer over the first organic layer; and a second organic layer over the second inorganic layer, wherein the intermediate layer comprises an emissive layer and a common layer, the common layer comprising portions that are separated from each other in the inactive area, and wherein the second electrode comprises portions that are separated from each other in the inactive area.

19. The organic light-emitting display apparatus of claim 18, wherein:

an edge of the first organic layer is spaced apart from the hole, and the first inorganic layer and the second inorganic layer are in direct contact with each other in the inactive area, and the first organic layer covers at least a part of a top surface of the first dam.

20. The organic light-emitting display apparatus of claim 18, further comprising:

a passivation layer below the first electrode and comprising an organic material;

a pixel defining layer covering edges of the first electrode; and a spacer over the pixel defining layer, wherein each of the first and second dams comprises a material that is the same as a material of the passivation layer.

21. The organic light-emitting display apparatus of claim 18, further comprises a plurality of metal patterns spaced apart from each other in the inactive area, wherein the plurality of metal patterns are located between the second dam and the hole.

22. The organic light-emitting display apparatus of claim 21, wherein the plurality of metal patterns comprises Au, Ag, Cu, Ni, Pt, Pd, Al, Mo, or Cr.

* * * * *